United States Patent [19]

Curran et al.

[11] Patent Number: 4,901,133

[45] Date of Patent: Feb. 13, 1990

[54] MULTILAYER SEMI-INSULATING FILM FOR HERMETIC WAFER PASSIVATION AND METHOD FOR MAKING SAME

[75] Inventors: Patrick A. Curran, Plano; Susan R. Wilson, Richardson, both of Tex.

[73] Assignee: Texas Instruments Incorporated, Dallas, Tex.

[21] Appl. No.: 847,357

[22] Filed: Apr. 2, 1986

[51] Int. Cl.$^4$ .................... H01L 45/00; H01L 29/34; H01L 29/04

[52] U.S. Cl. ......................................... 357/54; 357/2; 357/52; 357/59

[58] Field of Search .................. 357/52, 54, 59, 2, 48, 357/63.73

[56] References Cited

U.S. PATENT DOCUMENTS

| | | | |
|---|---|---|---|
| 4,001,873 | 1/1977 | Kajiwara et al. | 357/59 |
| 4,051,273 | 9/1977 | Abbas et al. | 357/54 |
| 4,161,744 | 7/1979 | Blashe et al. | 357/54 |
| 4,253,881 | 3/1981 | Hezel | 357/54 |
| 4,274,252 | 11/1979 | Kressel et al. | 357/54 |
| 4,508,749 | 4/1985 | Brannon et al. | 357/52 |

Primary Examiner—J. Carroll
Attorney, Agent, or Firm—Gary C. Honeycutt; Melvin Sharp; N. Rhys Merrett

[57] ABSTRACT

A film for hermetically passivating monocrystalline silicon includes sequential layers of undoped amorphous silicon, oxygen doped polycrystalline silicon, silicon rich oxynitride, and silicon nitride, and may be overlaid with an organic bulk dielectric such as polyimide. The inorganic film accurately sets the monocrystalline surface Fermi potential, independent of ambient electrical, mechanical, thermal, ionic, and moisture conditions. A method for depositing the amorphous silicon and the oxygen doped polycrystalline silicon layers of the film includes sequentially reacting monosilane in an inert carrier gas, such as helium or argon, and nitrous oxide. The layers are blended by varying the deposition temperature, the nitrous oxide flow rate, the monosilane flow rate, the monosilane dilution, and the inert carrier gas species. The layers are annealed to locally segregate the oxygen, to grow the grains to the proper size, and to set the final recombination velocity of the monocrystalline region.

14 Claims, 2 Drawing Sheets

MULTILAYER SEMI-INSULATING FILM FOR HERMETIC WAFER PASSIVATION AND METHOD FOR MAKING SAME

BACKGROUND OF THE INVENTION

1. Field of the Invention

This invention relates to methods and structures for accomplishing wafer passivation. and more particularly to methods and structures for accomplishing wafer passivation which employs multilevel films associated with a surface or termination of monocrystalline silicon.

2. Description of Related Art Including Information Disclosed under δδ1.97–1.99

The difficulty of surface charge control in monocrystalline silicon wafer processing, encapsulation, and device operation has long been a problem in the semiconductor industry. Surface charges or potentials affect device stability and reliability, and require continual process monitoring and adjustment. Various surface passivation techniques which have been advanced to address this problem, however, unsatisfactorily desensitize surface potentials to ionic, moisture, thermal, and stress effects.

Silicon dioxide passivation layers have been proposed, and are presently in widespread use, but have numerous disadvantages. Classical silicon dioxide passivation techniques adversely affect device performance by creating fixed positive charges near the siliconsilicon dioxide interface which alter the surface Fermi potentials. Silicon dioxide films are also sensitive to ionic redistribution, particularly to cations like sodium, and exhibit a strong reflection of surface charge onto the monocrystalline surface.

Additionally, moisture penetration of the silicon dioxide tends to enhance electron trapping, exacerbating hot carrier charge injection into the dielectric. Because silicon dioxide is deposited at relatively high temperatures, the silicon-silicon dioxide band structure (and hence the surface Fermi potential) is very sensitive to mechanical and thermal stresses: therefore, devices exhibit a piezoelectric sensitivity. The high temperature processing and the oxygen vacancies perturb the monocrystalline periodicity near the surface, which degrades the device boundary recombination velocity, and which, in turn, impedes minority carrier device operation, particularly in high voltage applications. High temperature processing also limits the construction of abrupt junction structures within the monocrystalline region. Thus, although silicon dioxide passivation of a monocrystalline silicon semiconductor region enhances semiconductor technology, it also limits the ultimate device performance in many instances.

Additional passivation techniques have been considered in attempts to overcome the silicon dioxide limitations. It has been proposed, for instance, to deposit silicon nitride films by low pressure chemical vapor deposition (LPCVD) or plasma assisted techniques over silicon dioxide passivation films. The silicon nitride films are hard, tend to be immune to alkali and halide ionic penetration, and provide a moisture barrier, but tend to crack easily, reducing their effectiveness as a passivation, and are sensitive to charge reflection. Excessive stresses result from the nitride film, and morevoer, techniques proposed to alleviate cracking tend to exacerbate the stress differentials.

The addition of organic films, such as polyimide, has been proposed. While organic films impede ionic penetration and are basically void of stress, they are generally a poor termination for a monocrystalline lattice, and are susceptible to moisture penetration.

Undoped polycrystalline silicon has been proposed to passivate P-N junctions. The undoped polysilicon tends to create a high surface recombination velocity that opposes a standing inversion layer and tends to laterally distribute any electric field associated with a reverse biased junction. However, undoped polysilicon passivation tends to be excessively leaky.

In addition, oxygen doped polycrystalline silicon films have been employed to reduce the leakage and to lower the surface recombination velocity, but are very sensitive to oxygen, moisture, and temperature effects.

Furthermore, a triple film passivation has been proposed comprised of undoped polysilicon, oxygen doped polycrystalline silicon, and silicon nitride. The triple sandwich, as proposed, however, does not permit adequate control of the surface Fermi potential by virtue of the process technique, and is subject to stress effects between the nitride and the oxygen doped polycrystalline silicon.

SUMMARY OF THE INVENTION

Therefore, in light of the above, it is an object of the invention to provide a hermetic wafer passivation film for monocrystalline silicon which eliminates fixed positive charge effects and stabilizes the surface potential against thermal and piezoelectric effects.

It is a further object of the invention to provide a hermetic wafer passivation film of the type described including a multilayer semi-insulating film together with an overlying organic polyimide layer.

It is a further object of the invention to provide a wafer passivation film of the type described which does not perturb the periodicity of the bulk monocrystalline lattice on which it is employed.

It is a further object of the invention to provide a wafer passivation film of the type described which controls the surface potential of the monocrystalline semiconductor on which it is employed, and desensitizes the surface potential to ionic, moisture, thermal, and stress effects.

It is a further object of the invention to provide a wafer passivation film of the type described which enables charge control throughout wafer processing, encapsulation, and device operation without impeding device stability.

It is a further object of the invention to provide a wafer passivation film of the type described which enables the boundary recombination velocity monocrystalline semiconductor on which it is employed to be adequately controlled, particularly in high voltage applications.

It is a further object of the invention to provide a wafer passivation film of the type described which enables abrupt junction structures in the monocrystalline semiconductor on which it is employed, without limiting the performance of the ultimate device.

It is a further object of the invention to provide a process for making a wafer passivation film of the type described.

These and other object, features, and advantages of the invention will become apparent to those skilled in the art from the following detailed description, when read in conjunction with the accompanying drawing and appended claims.

In light of the above, and in accordance with a broad aspect of the invention, a multilayer, semi-insulating, hermetic passivation film is provided for a monocrystalline silicon semiconductor substrate. The film includes sequential layers of undoped amorphous silicon, oxygen doped polycrystalline silicon, silicon rich oxynitride, and silicon nitride. A layer of organic polyimide overlies the film, whereby fixed positive charge effects are eliminated and the surface potential is stabilized against thermal and piezoelectric effects. The underlying inorganic layers accurately set the monocrystalline surface Fermi potential, independent of ambiemnt electrical, mechanical, thermal, ionic, and moisture conditions.

In one embodiment, the undoped amorphous silicon film is of thickness of between about 100 Å to 200 Å, with the unannealed grain size being less than about 10 Å, with totally depleted microcrystals, and larger than 10 Å, with the microcrystals saturated with oxygen after anneal.

In accordance with another broad aspect of the invention, a method is presented for making the hermetic wafer passivation film in a sequential in-situ series of reactions with a blending of reactant gases. A thin amorphous silicon film of thickness of between about 100 Å to 200 Å is first formed over the native oxide on the wafer surface, followed by the formation of a layer of oxygen doped polycrystalline silicon over the amorphous silicon silm. A silicon nitride layer is then formed over the polycrystalline silicon film to control the oxygen and moisture effects to establish a stable wafer passivation. Finally, an organic polyimide if formed overlying the film. The film is annealed to locally segregate the oxygen, to grow the grains to the proper size, and to set the final recombination velocity of the monocrystalline region, in a preferred embodiment at a temperature of about 1000° C. for about 60 minutes.

The amorphous silicon film is deposited by providing monosilane in an amount of about 5% by volume and diluted with argon at a temperature between 550° C. and 650° C. in a vacuum of about 650 mT, and the oxygen doped polycrystalline silicon is deposited by conducting a pyrolysis of monosilane and nitrous oxide in an inert carrier gas, such as helium or argon, at a temperature between about 540° C. and 700° C. The oxygen doped polycrystalline silicon film is blended with the underlying amorphous silicon film by varying the deposition temperature, the nitrous oxide flow rate, the monosilane flow rate, the monosilane dilution, and the inert carrier gas species.

BRIEF DESCRIPTION OF THE DRAWING

The invention is illustrated in the accompanying drawing wherein.

DETAILED DESCRIPTION OF THE PREFERRED EMBODIMENTS

In accordance with the invention, hermetic wafer passivation of a monocrystalline silicon semiconductor is accomplished with a multilayer semi-insulating film (SIPONT) and an overlying organic polyimide. The passivation eliminates fixed positive charge effects and stabilizes the surface potential against thermal and piezoelectric effects.The multilayer SIPONT film can be deposited by low pressure chemical vapor deposition techniques under computer control in a single pump-down operation at low temperatures such that the bulk monocrystalline lattice periodicity is not perturbed.

Figure 1:
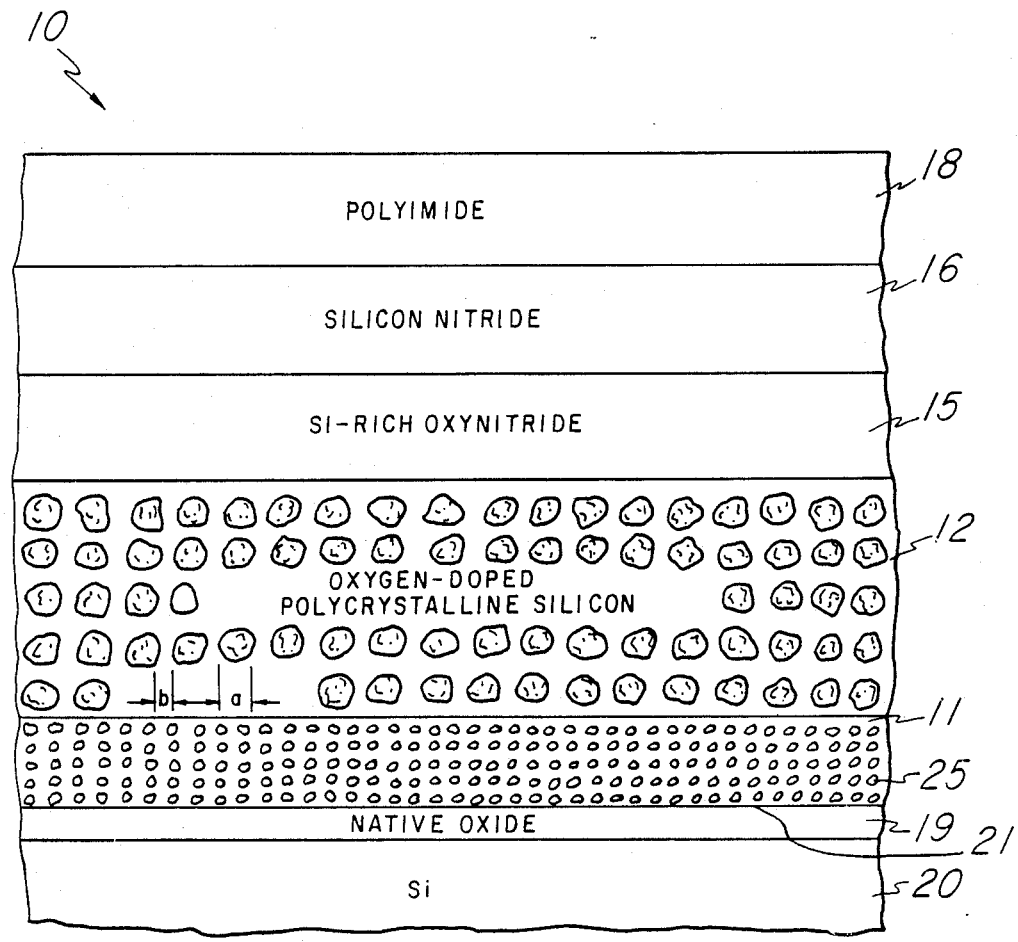
FIG. 1 is a side cut away view of a portion of a semiconductor substrate on which is formed the passivation film, in accordance with a preferred embodiment of the invention.

With reference to FIG. 1, the hermetic wafer passivation is accomplished with an in-situ deposited multistrata film SIPONT 10, including a layer 11 of undoped amorphous silicon, a layer 12 of oxygen doped polycrystalline silicon, a layer 15 of silicon rich oxynitride, and a layer 16 of silicon nitride that accurately sets the monocrystalline surface Fermi potential independent of ambient electrical, mechanical, thermal, ionic,and moisture conditions. The film is subjected to a post deposition anneal and, together with an overlying polyimide overcoat 18.

In the fabrication of the film 10, the silicon substrate or wafer 20 is stripped or cleaned of any surface oxides to expose the monocrystalline surface or termination regions 21. The wafer 20 can be cleaned by any conventional chemical techniques, but it should be appreciated that most chemical cleaning techniques leave a thin chemical oxide onthe surface. Since any remaining chemical or native oxide is deleterious to the final surface Fermi potential, the wafer 20 is exposed to a dilute hydrofluoric acid deglaze to remove as much of the remaining oxides as possible. Even with great precaution, however, an undesirable layer of thin (6–10 ÅA) native oxide 19 is generally unavoidable.

We have found that virtually all of any remaining native oxide can be reduced by depositing and annealing a thin layer of amorphous silicon 11 on the surface 21 of the wafer 20. The amorphous silicon film 11 can be annealed by several means, for example, by a halogen lamp anneal, as below described, in detail.

Figure 2:
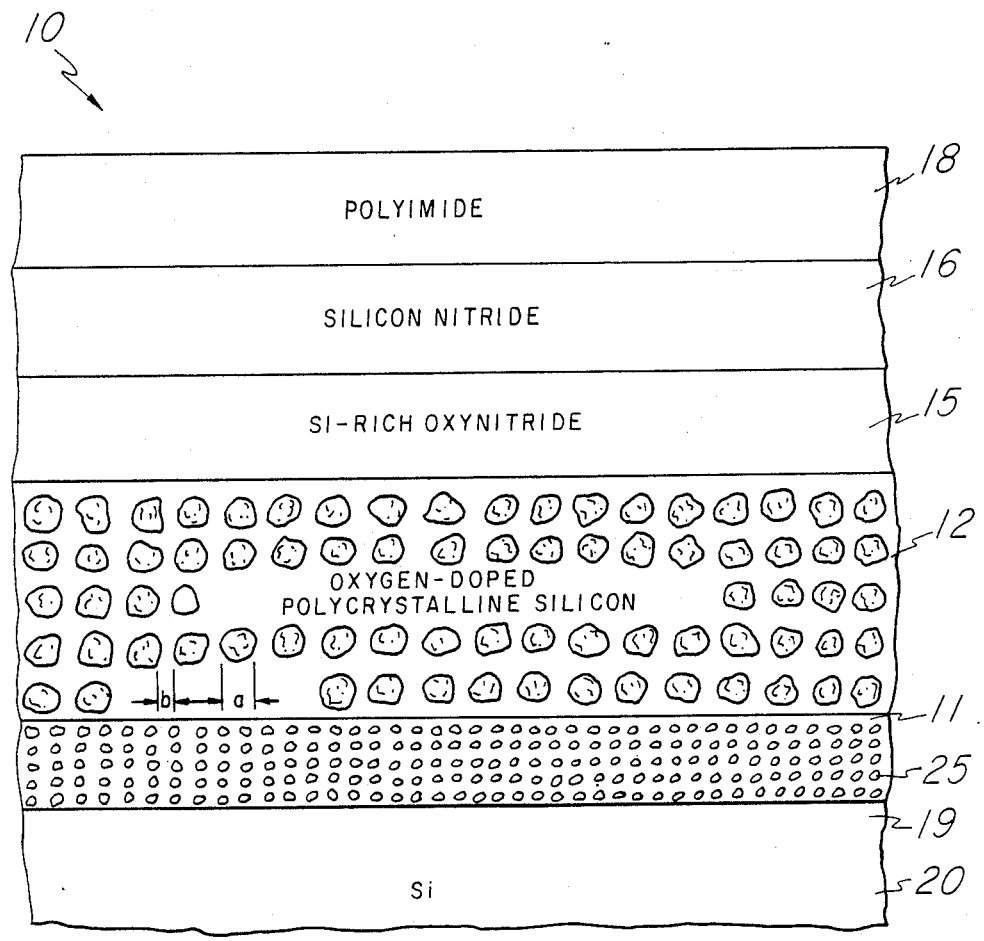
FIG. 2 is a side cut away view of a portion of a semiconductor substrate on which is formed the passivation film, in accordance FIG. 1, which has been annealed in accordance with a preferred embodiment of the invention.

Annealing the amorphous layer 11 causes its grains 25 to grow in size, accompanied by a precipitation of oxygen in its grains and along its grain boundaries, as shown in FIG. 2. This precipitation causes a redistribution of the oxygen in the native oxide at the surface 21 of the wafer 20. Ideally, the native oxide should be removed from the surface 21 of the wafer 20 such that the transport through the SIPONT film 10 is limited by the intergranular dielectric in the oxygen doped polycrystalline film 12 (below described in detail so that there is a lesser potential energy barrier imposed by any remaining native oxide at the surface 21. (It should be noted that in addition to redistributing the oxygen of the native oxide, the amorphous silicon layer 11 also sets the recombination velocity at the monocrystalline region termination.)

The amorphous silicon layer 11 is deposited by the pyrolysis of monosilane (SiH$_4$) in a low pressure chemical vapor deposition (LPCVD) reactor (not shown). Since it is desirable that this layer be thin, for instance between about 100 Å to 200, the deposition process should be reasonably controlled to ensure proper grain structure. Therefore, the monosilane is diluted with an inert gas, such as argon or helium, with the monosilane being typically 5% by volume. In this manner, no carrier gas is required for the pyrolysis and reasonably controlled deposition rates can be obtained. A typical flow rate of the argon diluted monosilane is 50 cc/min.

It has been observed that the grain structure of the deposited film is very sensitive to the growth temperature. Below 580° C. the grains are less than 10 Å and the films are amorphous. Above 600° C. the grains become larger with increasing growth temperature and the films are polycrystalline in nature. The smaller grains grow much larger with improved order upon subsequent annealing whereas the large as-deposited polycrystalline grains exhibit minimal grain growth upon anneal. The residual stresses of the various grain structures are very different. Moreover, the solid solubility of oxygen into the grains or the precipitation of oxygen out of the grains are dependent upon the as-deposited grain structure and the subsequent anneal conditions. Consequently, the characteristics of the termination or surface 21 of the monocrystalline region 20 can be in part set by the amorphous silicon deposition conditions in conjunction with the subsequent anneal. For instance at a deposition temperature of about 620° C. in a vacuum of about 650 mT with 5% argon diluted monosilane, the amorphous silicon deposition rate is typically 50–100 Å min.

After setting the desired surface recombination velocity by the very thin amorphous silicon layer 11, a layer 12 of oxygen doped polycrystalline silicon is deposited in the LPCVD reactor. The oxygen doped polycrystalline silicon and amorphous silicon films are preferably deposited by a sequential in-situ series of reactions with a blending of reactant gases, as deviation from a blended transition may deleteriously alter the surface Fermi potential of the monocrystalline region 20. Normally the oxygen doped polycrystalline silicon film 12 can be formed by the LPCVD pyrolysis of monosilane and nitrous oxide in an inert carrier gas, such as argon or helium, at temperatures of between about 540° C. and 700° C. Alternate techniques of providing oxygen can be implemented with other reactant species such as carbon dioxide. The oxygen concentration in the film can be varied by the silane to nitrous oxide ratio, deposition temperature and pressure. The film characteristics are also very sensitive to the magnitude of the gaseous flow rates in addition to the relative ratios due to thermal capacitive effects. While it is advantageous to employ a diluted monosilane for the amorphous silicon film, it is more desirable to enhance the monosilane concentration with respect to the inert gas in order to reduce the reactant gas depletion and the thermal gradient introduced by a high inert gas flow rate. This is particularly important in a tube reactor, but is much less a factor if a dome LPCVD reactor is employed. A pure monosilane gas can be blended in while the diluted monosilane flow rate can be gradually reduced.

The oxygen doped polycrystalline silicon film 12 has microcrystalline grains of silicon with saturated oxygen, and a surrounding partial oxide between the grains. The grain size and the oxide composition are controlled by the oxygen concentration, the deposition conditions, and the annealing conditions. The grain size is usually small, for example, between about 10 Å and 300 Å, and the microcrystals are totally depleted due to the interface traps at the crystal boundaries. At lower depostion temperatures and higher oxygen concentrations, the films are essentially amorphous with silicon microcrystals in a sea of partially oxidized silicon compounds ($Si_2O$, $SiO$, and $Si_2O_3$) and amorphous $SiO_2$. Oxygen concentrations are typically between 10–40% by volume. Consequently, upon annealing the oxygen tends to segregate out, since it is well above the solid solubility in silicon. Since the $SiO$ bond that maximizes the granular surface area, higher annealing temperatures form larger silicon grains with thicker intergranular dielectric. Upon annealing, the total oxygen and silicon concentrations remain constant, but the grain structure is modified. The degree of grain growth upon subsequent annealing is heavily dependent upon the as-deposited growth conditions. It is believed that the large number of traps in the inter-granular dielectric with energies near the midband tend to deplete the small microcrystalline silicon grains. The inter-granular oxide barrier varies between 2 Å to 10 Å depending on the concentration of oxygen in the film, e.g., 10% to 40%. Depletion of the grains forces the Fermi level near the midgap energy and the grains act like intrinsic crystals. Conduction occurs by means of tunneling through the oxide barrier. The oxygen concentration controls the inter-granular oxide barrier, thereby, the film conductivity. As a result, the oxygen doped polycrystalline silicon film is semi-insulating with the conduction controlled by the oxygen concentration. Consequently, oxygen doped polycrystalline silicon films form a passivation for silicon that does not modulate the boundary surface Fermi potential and which prevents capacitive charge reflection through the film due to the low level current transport through the film as controlled by the inter-granular dielectric structure.

The oxygen doped polycrystalline silicon film blended with an underlying amorphous silicon can be constructed, for example, by holding the temperature and monosilane flow rate constant while introducing a second gas to serve as the oxygen source, such as, for instance, nitrous oxide. The deposition temperature is 540°–650° C. typically with a flow rate of 50 cc/min. argon diluted monosilane (5% by volume). After 2 minutes of amorphous silicon deposition, approximately 200 Å thick, nitrous oxide is turned on with a flow rate of approximately 3 cc/min. This process results in an oxygen doped polycrystalline silicon film of approximately 10–20% oxygen concentration with a deposition rate of 21 Å/min. of thickness of, for instance, about 2500 Å.

The oxygen doped polycrystalline silicon characteristics can be modified by varying the deposition temperature, the nitrous oxide flow rate, the monosilane flow rate, the monosilane dilution, and the inert carrier gas species. In addition to directly modifying the film characteristics, these process variations alter the inherent oxygen doped polycrystalline silicon stress conditions, which in turn modify the monocrystalline region boundary recombination velocity. It should be noted that the inherent oxygen doped polycrystalline silicon film stresses tend to be slightly tensile.

Although the amorphous and oxygen doped polycrystalline silicon films set the characteristics of the termination or surface 21 of the monocrystalline region 20, they are prone to subsequent oxygen and moisture effects, and can be somewhat unstable. To alleviate this problem, the addition of an upper silicon nitride layer can be employed. However, if the silicon nitride is deposited at higher temperatures a large stress variation with respect to the underlying semi-insulating films can be introduced. In order to reduce silicon nitride cracking, compressive silicon nitride films must be deposited, but these can degrade the tensile semi-insulating film. The solution to this problem is to provide a silicon rich oxynitride layer 15 in slight tension to provide a stress relief and to buffer the semi-insulating region 12 from the reduced stress differential of the tensile silicon nitride 16. The silicon rich oxynitride layer 15 is formed by a sequential in-situ LPCVD reaction, blending the silicon rich oxynitride to the tensile silicon nitride.

The process for forming the silicon nitride and silicon rich oxynitride is as follows. After the oxygen doped polycrystalline silicon film 12 is deposited, an ammonia gas (NH$_3$) at a flow rate of about 250 cc/min. is added to the reaction while the temperature is ramped from the oxygen doped polycrystalline silicon deposition temperature of approximately 650° C. to a higher temperature of about 810° C. During the temperature transition, a silicon rich oxynitride layer 15 will form, blended at an interface with said oxygen doped polycrystalline silicon, with favoritism towards oxidation rather than nitridation, particularly at the lower temperatures. As the temperature nears 810° C., increased nitridation occurs. The process is allowed to stabilize at 810° C. for approximately 15 minutes prior to terminating the nitrous oxide flow, resulting in a deposition of an oxynitride region 15 of approximately 1000 Å thick for a total deposition time of about 30 minutes. Again the film characteristics can be modified by utilizing a more concentrated monosilane and/or a different inert carrier gas, such as helium. Upon completion of the oxynitride film, the nitrous oxide flow is ceased and a slightly tensile silicon nitride (Si$_3$N$_4$) is grown. For the argon diluted monosilane process, gaseous flow rates of about 50 cc/min SiH$_4$ (5%) and 250 cc/min NH$_3$ at a deposition temperature of about 810° C. in a vacuum of approximately 800 mT, results in a deposition rate of about 20 Å/min. A suitable typical, silicon nitride film thickness is about 1200 Å with a total deposition time of about 60 minutes.

The purpose of the oxynitride layer 15 is stress relief while the intent of the silicon nitride layer 16 is to prevent oxygen and moisture penetration that may alter the underlying oxygen doped polycrystalline silicon and amorphous silicon layers 12 and 11. To further enhance the silicon nitride passivation with additional stress relief, is desired, a low temperature silicon nitride (not shown) may be inserted between the oxynitride and high temperature (810° C.) silicon nitride film. To accomplish this film, the reaction temperature can be stabilized between 700°-780° C. and the nitrous oxide flow is turned off. This results in a lower temperature oxynitride (favoring oxidation) followed by a low temperature silicon nitride with a stress closer to that of the oxygen doped polycrystalline silicon film. Upon the completion of the desired thickness of the low temperature silicon nitride (which is more likely silicon rich nitride,), then the temperature is ramped to 810°-850° C. to grow a stronger, more tensile silicon nitride (Si$_3$N$_4$). The resultant film will reduce piezoelectric effects while still providing an excellent barrier to oxygen and moisture.

After the silicon nitride has been deposited, the wafer is removed from the LPCVD reactor. The SIPONT film may be selectively patterned by normal photoresist lithography techniques followed by a two step wet/dry etch. Although a totally dry etch procedure is viable and advantageous, there are applications where a wet/dry etch process are particularly desirable. The silicon nitride and oxynitride regions are first etched by a dry plasma etched masked by photoresist. The etch is can be performed in a vacuum of 1.0 torr with a power of 800 watts with a CF$_4$ flow rate of 1000 cc/min. This process etches silicon nitride at approximately 200A/min. The plasma etch is significantly retarded in the oxygen doped polycrystalline silicon, which is then etched by means of a wet etch comprising NH$_4$F (40%):H$_2$O$_2$(30%):HF(100%) in a 10:6:1 mixture. The etch is masked by the original photoresist (or by Si$_3$N$_4$ if the photoresist has broken down). The above wet etch removes oxygen doped polycrystalline silicon with an etch rate of approximately 1500 Å/min.

Finally, an anneal is performed to segregate the oxygen locally, to grow the grains of the amorphous silicon layer 11 and oxygen doped polycrystalline silicon layer 12 to the proper size, and to set the final recombination velocity of the monocrystalline region. The anneal can be done in a high temperature ambient, for example, argon or even oxygen, at a temperature of about 1000° C. for approximately 60 minutes. In instances in which this type of anneal may undesirably perturb the bulk monocrystalline region, an alternative (and preferred) method is to employ a rapid thermal anneal using halogen lamps for about one minute. The anneal can be performed prior to, or after, SIPONT patterning with slightly modified etch conditions of the oxygen doped polycrystalline silicon film.

Upon completion of the SIPONT film anneal, the wafer is further passivated with an overlying organic polyimide film 18 to block ions, to impede moisture (free water), and to provide stress relief with respect to subsequent encapsulation techniques. Any formulation of polyamic acid may be employed; for instance, it has been found that polyamic acid sold under the Trademark "PIQ-13" by Hitachi can be advantageously employed. Although the polyamic acid adheres well to the Si$_3$N$_4$ surface, other exposed surfaces require an adhesion promoter, such as a coupler sold under the Trademark "Coupler-3" by Hitachi. The coupler, which is an aluminum chelate, can be spun on and air baked at 350° C. to form an aluminum oxide. The polyamic acid is next spun onto a thickness of between about 2 to 6 microns and soft baked, followed by a normal photoresist spin, soft bake, expose, and develop process. Following the photoresist develop, an anneal is performed at about 130° C. to 140° C. for 30 to 60 minutes to hard bake the photoresist and to partially imidize the polyamic acid in order to facilitate well sloped vias. The partially imidized polyamic acid is etched in propanol diluted tetramethyl ammonium hydroxide to form the contact windows. The solvents are next evaporated from the polyamic acid with a 40 minute bake at 201° C. in nitrogen. The photoresist is stripped by means of a wet chemical process and the polyamic acid is fully imidized in a 350° C. bake in air for about 60 minutes. In the fully imidized state, polyimide resists both dry and wet processes associated with the SIPONT patterning. Hence, the patterned polyimide can be used as the etch mask for a simplified, one mask passivation overcoat process.

Although the invention has been described and illustrated with a certain degree of particularity, it is understood that the present disclosure has been made by way of example only and that numerous changes in the combination and arrangement of parts or steps may be resorted to by those skilled in the art without departing from the spirit and the scope of the invention as hereinafter claimed.

We claim:

1. A multilayer semi-insulating passivation film for monocrystalline silicon comprising:

a layer of amorphous silicon on a surface of the monocrystalline silicon, a layer of oxygen doped polycrystalline silicon overlying the amorphous silicon, and
an interface layer therebetween comprising a mixture of amorphous and polycrystalline silicon.

2. The film of claim 1 wherein said film further comprises: a layer of organic polyimide overlying said film.

3. The film of claim 1 further comprising:
a layer of silicon rich oxynitride overlying the oxygen doped polycrystalline silicon,
an interface layer therebetween comprising a mixture of silicon rich oxynitride and oxygen and doped polysilicon, and
a layer of silicon nitride overlying the silicon rich oxynitride, including an interface layer therebetween, comprising a mixture of the nitride and oxynitride.

4. The passivation film of claim 3, wherein said amorphous silicon layer is of thickness of between approximately 100 Å to 200 Å.

5. The passivation film of claim 3 wherein said oxygen doped polycrystalline silicon layer is of thickness of about 2500A.

6. The passivation film of claim 3 wherein the silicon nitride layer is approximately 1200 Å thick.

7. The passivation film of claim 3 wherein the silicon rich oxynitride layer is approximately 1000 Å thick.

8. The film of claim 1 wherein said amorphous silicon layer has a grain size of less than 10 Å.

9. The film of claim 1 wherein the layer of oxygen doped polycrystalline silicon comprises:
microcrystalline grains of silicon
and a surrounding partial oxide between the grains.

10. The film of claim 9 wherein the grains of said oxygen doped polycrystalline silicon layer are between about 10 Å and 300 Å and the microcrystals are totally depleted of oxygen.

11. A passivation overcoat for hermetically sealing monocrystalline semiconductor termination regions, comprising:
a multilayer inorganic film, including:
a layer of amorphous silicon,
a layer of oxygen doped polycrystalline silicon on said amorphous silicon layer and an interface layer of polipilicon mixed with said amorphous silicon layer.
a layer of silicon rich oxynitride on said oxygen doped polycrystalline silicon layer and an interface layer of oxynitride mixed with said oxygen doped polycrystalline silicon layer,
and a layer of silicon nitride on said oxynitride layer and an interface layer of nitride mixed with said oxynitride layer.
and a layer of organic polyimide overlying said multilayer inorganic film.

12. A hermetic passivation film for a monocrystalline silicon semiconductor termination comprising:
a multilayer semi-insulating film, including:
a layer of undoped amorphous silicon film on said termination,
a layer of oxygen doped polycrystalline silicon overlying said undoped amorphous silicon film of thickness between about 10° to 300°, said layer of oxygen doped polycrystalline silicon comprising microcrystalline grains of silicon saturated with oxygen and a surrounding partial oxide between the grains, and
an interface layer therebetween, comprising a mixture of undoped amorphous silicon and said oxygen doped polycrystalline silicon.

13. The film of claim 12 wherein said undoped amorphous silicon has microcrystals which are totally depleted of oxygen.
and futher comprising a layer of organic polyimide overlying said multilayer semiinsulating film.
whereby fixed positive charge effects are eliminated and the surface potentialis stabilized against thermal and piezoelectric effects.

14. The film of claim 13 further comprising:
a layer of silicon rich oxynitride over said layer of oxygen doped polycrystalline silicon including a mixed interface layer,
and a layer of silicon nitride over said layer of silicon rich oxynitride including a mixed interface layer.

* * * * *